United States Patent [19]

Steiner et al.

[11] Patent Number: 5,181,257

[45] Date of Patent: Jan. 19, 1993

[54] METHOD AND APPARATUS FOR DETERMINING REGISTER DIFFERENCES FROM A MULTI-COLOR PRINTED IMAGE

[75] Inventors: Gerd Steiner, Heusenstamm; Rudi Weniger; Rolf Braun, both of Offenbach am Main; Rainer Otterbach, Siegen; Erhard Schubert, Bad Berleburg; Ralf Hofmann, Siegen, all of Fed. Rep. of Germany

[73] Assignee: MAN Roland Druckmaschinen AG, Fed. Rep. of Germany

[21] Appl. No.: 689,200

[22] Filed: Apr. 22, 1991

[30] Foreign Application Priority Data

Apr. 20, 1990 [DE] Fed. Rep. of Germany ....... 4012608

[51] Int. Cl.$^5$ ............................................. G06K 9/46
[52] U.S. Cl. ..................................... 382/17; 250/559; 250/571; 382/8; 382/34
[58] Field of Search .................... 382/17, 42, 34, 30, 382/22, 8; 250/559, 561, 563, 571, 565; 356/421, 429; 364/469, 471; 358/106, 107

[56] References Cited

U.S. PATENT DOCUMENTS

| 4,561,103 | 12/1985 | Horiguchi et al. | 382/24 |
| 4,677,680 | 6/1987 | Harima et al. | 382/34 |
| 4,685,139 | 8/1987 | Masuda et al. | 382/34 |
| 4,882,764 | 11/1989 | Reynolds et al. | 382/42 |
| 4,885,785 | 12/1989 | Reynolds et al. | 382/42 |
| 5,018,213 | 5/1991 | Sikes | 382/8 |

FOREIGN PATENT DOCUMENTS

| 0079153A1 | 12/1983 | European Pat. Off. . |
| 0177885A2 | 6/1986 | European Pat. Off. . |
| 0221472A2 | 2/1987 | European Pat. Off. . |
| 0272853A2 | 3/1988 | European Pat. Off. . |
| 0127831B1 | 7/1990 | European Pat. Off. . |
| 3231067A1 | 4/1983 | Fed. Rep. of Germany . |
| 3709858A1 | 3/1987 | Fed. Rep. of Germany . |
| 3719766A1 | 11/1988 | Fed. Rep. of Germany . |

OTHER PUBLICATIONS

"Drucker-Frage: Wiegenaumubein Druckpassen, damiterpabt?", by Dr. Ing. Rolf Bosse, 1990, *Drucktechnik/Druckbogenmontage*.

Primary Examiner—Joseph Mancuso
Attorney, Agent, or Firm—Leydig, Voit & Mayer

[57] ABSTRACT

A system and method for determining register differences between the images making up a multi-color printed image. A color video camera with macro optics scans at least a part of the image. The video image is processed to derive a plurality of single-color images, information from which is stored in respective single color memories. A register-checking location is selected having a contour in the printed image which has at least two superimposed single colors. The information in the color memories is processed to determine separation contours for the respective colors. Offsets are determined for the contours in the respective image memories as a measure of register differences between the images.

20 Claims, 5 Drawing Sheets

METHOD AND APPARATUS FOR DETERMINING REGISTER DIFFERENCES FROM A MULTI-COLOR PRINTED IMAGE

FIELD OF THE INVENTION

This invention relates to multi-color printing, and more particularly to a method and apparatus for determining register differences between the single color images making up the multi-color print.

BACKGROUND OF THE INVENTION

In multi-color printing, such as sheet-fed offset printing, individual partial images in the various colors (e.g., yellow, cyan, magenta and black) are printed one over the other on the same sheet in respective printing units. In some cases, partial images or surfaces are also printed in separate, decorative or house colors (such as in packaging printing, high quality publicity brochures, and the like). As is well known, the quality of the printed products depends greatly upon the accuracy of the superimposition of the partial images. Ideally, the individual partial images coincide precisely with their required positions on the printed sheet. Departures from this ideal condition are recognized as register differences and referred to as register errors. Such departures degrade the printed image, but the subjective analysis of image degradation is usually insufficient to quantify the register error. But it is recognized that an inferior image is often the result of these register errors.

In order to quantify the value and controllably eliminate register errors, register marks, register symbols or other measuring elements are often printed on the sheet with the individual partial images. These enable register differences of the different partial images relative to one another to be quantitatively determined. Usually, these register marks or the like are printed in an area which is free of printed text, such as in the margins or at the corners of the printed sheet. It is then possible, from an examination of the register marks to determine register differences and thus the adjustments required for the printed plate or cylinder associated with a specific partial image.

Register symbols in the form of crosses can allow a rapid determination that there is no register difference and hence no register error. However, determination and quantification of the register difference using such register crosses and a measuring microscope or the like is tedious and time-consuming.

Tools are available to facilitate register difference determination. For example, the FOGRA venier measuring element or the "Interferenz-Vernier" described in Deutscher Drucker No. 1, 1990, pp. W27-30 provides read-off convenience and also improves read-off accuracy. It requires, however, relatively considerable space in the unprinted area in the partial image prints.

Apart from visual determination of register differences, automated measuring equipment is also available which cooperates with specially devised register marks to determine register differences, such as by photoelectric scanning of the marks. Register marks and corresponding scanning equipment of this type is described, for example, in German published patent application DE 3,709,851 A1 and DE 3,719,766 A1. The disadvantage of such equipment is that special register marks are required and become inflexible in the long term. Moreover, the scanning equipment is usable only for the register determination and is not of general applicability or useful for other purposes.

The subject of video technology with image processing for determining register differences by means of register crosses is discussed in European published application EP 177885 A2 and EP 221472 A2. Register difference determination in those systems is interactive and semi-automatic. The register crosses are recorded by a video camera and shown on an enlarged scale on a monitor activated by an operator by means of a cursor control. An evaluation computer determines register differences from the image coordinates. Just as in the case of determination with a magnifier or microscope, the accuracy of register difference determinations on these systems depends on the printed quality of the register crosses, i.e., on the contour sharpness. Minor register differences can be reliably determined only with very fine register cross lines, and accordingly the blurred structure of such fine lines due to the print and roughness of the paper has a negative impact at high magnification.

Register difference determination by use of dedicated register symbols, register marks or measuring elements printed on the sheet solely for register determination has the disadvantage that, first of all, additional space is required to accommodate the marks. Secondly, the state of coincidence of the partial images in the actual printed text (which is the key factor for the quality of the printed product) is not necessarily in coincidence with the register symbols often printed in the margins. The experienced printer, therefore, usually does not check register solely by reference to the register symbols printed in the margins of the sheet, but also by reference to a number of printed image details which are important to the print and also clearly show register differences.

Printed image details which can show register differences are, for example, colored indicia formed by superimposing at least two colored inks on a single color or unprinted background. Others are light colored indicia (e.g., unprinted areas) on a dark background which is formed by superimposing at least two colored inks (e.g., by a reverse character). Other image details particularly suited to detecting register differences are contours formed by a number of partial images such as hair lines, hands of clock, image lines or the like.

An example of a negative or reverse image referred to above is a letter formed of an unprinted area in a background produced by superimposing two or more colors such as magenta and cyan. Register differences of the cyan image with respect to the magenta then appear as correspondingly fine cyan or magenta color fringes. Color fringes due to register differences can be detected very easily in the case of long and rectilinear contours. The reason for this lies, at least in part, in the vernier visual acuity of the eye and in the color contrast of a color fringe.

If, however, register differences of this type are to be assessed on a number of key locations in the printed image, there can be required a tedious method which demands substantial experience and even then is difficult to produce quantified results. A number of measurements are required to be able to detect the distribution of the register or register differences over the printed sheet and thereby effect optimal adjustment of the register controls. Furthermore, detecting register differences by color fringes is difficult of quantification and thus it demands great experience to view an image with a color fringe and determine the precise amount of register adjustment to be applied to the press.

Published European patent application EP 127831 A2 describes register difference determination using a video camera followed by a computer unit. The position of different colored raster dots relative to one another in the image is compared with their required position. The raster dots are used almost like register symbols which, if the partial images are in the optimal relative positions, occupy specific and exactly predetermined distances one from another. A disadvantage of this approach is that the required position of the raster dots in the individual partial images relative to one another must be known. Thus, it appears that the measuring principle of this proposal is suitable primarily for assessing and determining register behavior of the partial images of an image location where they are recorded on a moving printed web. Thus, it is possible to assess the same image locations of consecutive printed images in respect of their register behavior.

In summary, it can be said of the prior art techniques which utilize printed dots, those which require an analysis on a dot-by-dot basis are not as workable as can be desired, and do not generally provide the necessary flexibility. Those systems which scan register marks are deficient in that the register marks are not within the image itself, and the register marks also present certain difficulties as noted above.

SUMMARY OF THE INVENTION

In view of the foregoing, it is a general aim of the present invention to provide a register-determining system which scans the image to produce a color video image of the dots which form the printed image, but which then analyzes that image to identify image contours, and uses such image contours, not the individual dots, as a means for checking register differences.

In that regard, it is an object of the present invention to provide a method and apparatus for determining register differences which avoids the need for special purpose register marks, which images the dots in the actual printed image, but which correlates information from the dots to produce image information which is then analyzed to detect register differences.

A general object of the present invention is to provide a method and apparatus for determining register differences in multi-color printing which focuses on critical contours in the printed image but which is largely independent of the type of or peculiarities in the dots which make up the image.

Thus, in accordance with the invention, there is provided a method of determining register differences in a multi-color printed image formed of a plurality of superimposed single color printed images. The method comprises scanning at least a part of the multi-color printed image with a color video camera to produce an enlarged electronic image of a size adequate to resolve individual dots making up the image. Preferably, the color video camera has a macro imaging system associated therewith. The video image is processed to derive a plurality of single-color images, and information from the single color images is stored in respective color memories. A register-checking location in the printed image is selected, and preferably includes a contour having at least two superimposed single colors. Separation contours are then determined in the respective single color images from the information stored in the respective color memories at the register-checking location. Having determined the contours in the single color images, the offsets between the separation contours are then determined as a measure of register differences between the single color images.

It is a feature of the invention that register differences are determined accurately on the image itself and without the need for special purpose register marks. According to this feature, the dots which make up the contour are examined but only insofar as they relate to the contour, and differences between the separation of register differences.

Other objects and advantages will become apparent from the following detailed description when taken in conjunction with the drawings, in which:

BRIEF DESCRIPTION OF THE DRAWINGS

FIG. 2b is a diagram showing additional details on the construction of the color video camera of the system of FIG. 2a;

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1A:
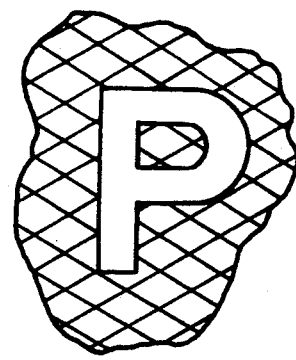
FIGS. 1a-1c illustrate a portion of a printed image and identify a contour which when separated allows for determination of register differences in accordance with the invention.

Turning now to the drawings, FIG. 1a shows an example of a contour created by a negative or reverse character, in this case, the character "P". For the sake of simplicity, the letter "P" is assumed as being in the form of an unprinted area of the paper on a background formed by superimposition of the colors cyan and magenta. It is also assumed for the present example that the two partial images of cyan and magenta are printed in approximately identical raster dot sizes and at approximately the ideal densities for optimum coloring. These conditions give a background having a blue-violet tint. It will become apparent, however, that neither the requirement of the same dot size nor of ideal densities is a requirement to the practice of the present invention.

Figure 1B:
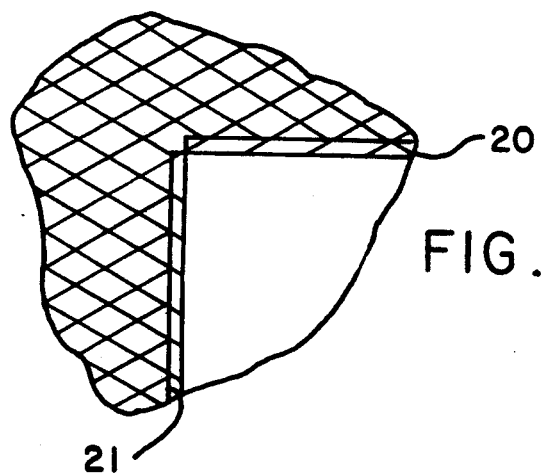
Figure 1C:
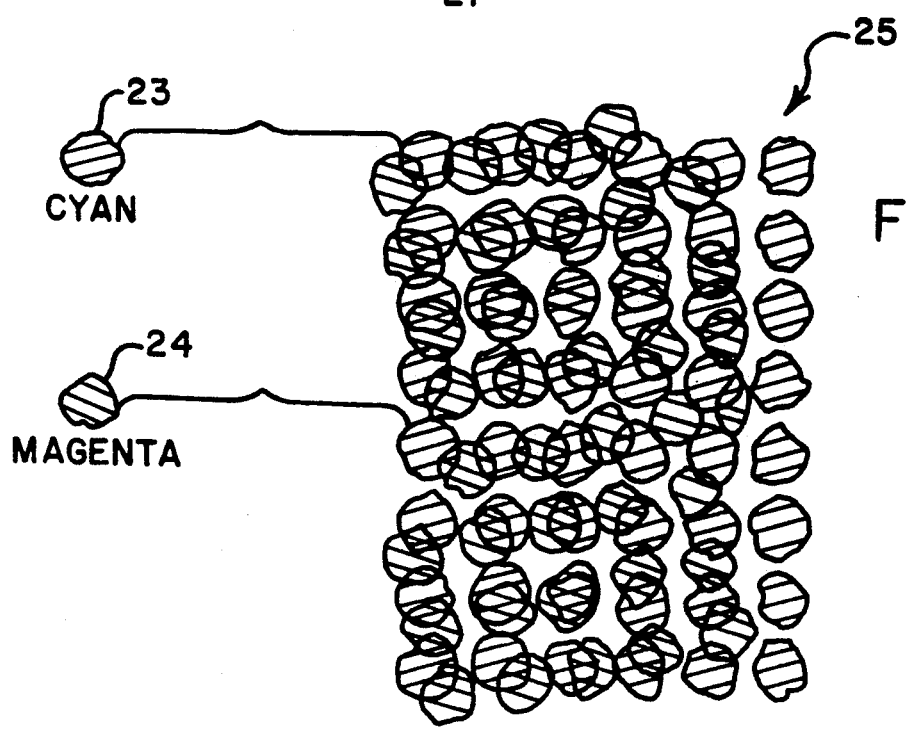

FIG. 1b shows the upper lefthand corner of the letter "P" in an enlarged scale. As indicated, the magenta and cyan images are not printed in identical register with each other. Thus, a register difference can be detected in the form of one or more color fringes 20, 21, the color of which depends on the nature of the register difference and which of the partial images overlaps the other. Of course, other colors may be involved as has already been noted, and the present example of two colors is selected for simplicity in illustrating the principles of the invention. FIG. 1c shows on a further enlarged scale a contour of the same image location. The scale in FIG.

1c is enlarged by a factor of about 120 for a printed image having a raster width of about 60 lines per centimeter. The raster dot structure (i.e., the printed dots) of the partial images individually and superimposed will be clearly apparent. The cyan dots are identified by reference numeral 23 and the magenta dots by 24. It is seen that a color fringe 25 can be detected in FIG. 1c where a column of cyan dots is not overlied by a similar column of magenta dots.

As will be apparent from FIG. 11c, the discrete raster dots are not perfectly circular nor are they identical. They can be considered, when comparing individual dots, to give blurred images to varying degrees according to the paper roughness, the smoothness with which an individual dot is printed, and the like. This is the type of image that the observer would see looking at the image location through a measuring microscope with appropriate magnification.

Thus, the image of FIG. 1c demonstrates the register difference determinations even at contours can lead to a fairly uncertain result. Thus, one could attempt to quantify the register difference associated with 25, but due to the irregular size of the dots, changes across the image location and the like, such quantification, with any degree of repeatability, would be very difficult. Matters can be further complicated if the contour has different raster dot sizes due to the superimposition of more than two colors, or if the area of the letter itself is also printed in one or more colors, for example, with a smaller raster dot size. Results, on viewing of the image through a microscope, are not improved by greater magnification, since the multiple superimposed printing the very jagged raster dot structure results in the most diverse color impressions such that the contours of the discrete images are difficult if not impossible to recognize.

Figure 2A:
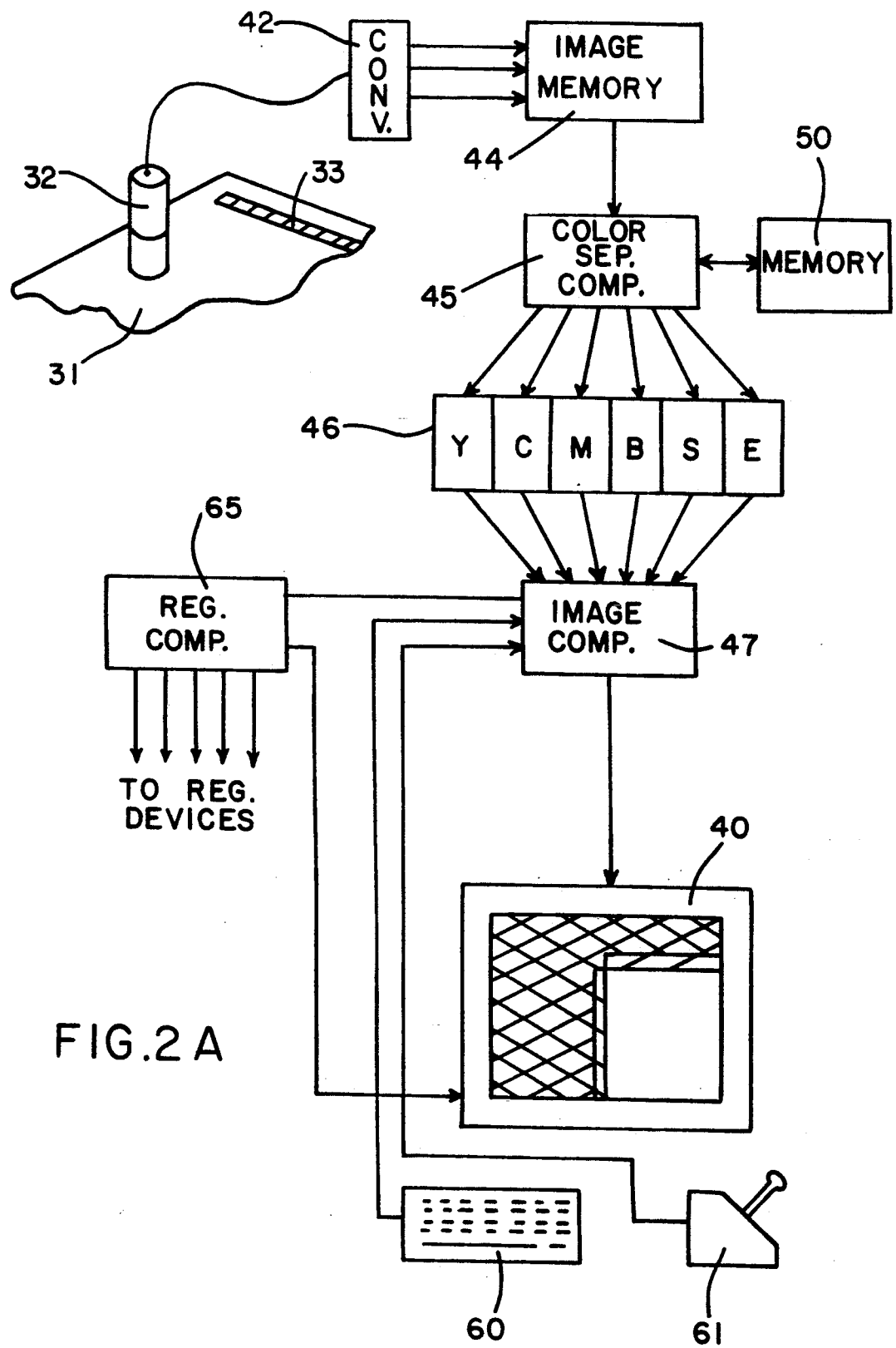
FIG. 2a is a block diagram illustrating a system according to the present invention.

Turning to FIG. 2a, there is shown a system constructed in accordance with the invention and capable of accurately determining quantitative register differences from information like that illustrated in FIGS. 1a–1c.

A printed sheet 31 carries a multi-colored printed image (not shown) with a characteristic subject, such as the image of FIGS. 1a–1c to be scanned by a video camera 32. The printed sheet 31 also carries a color check strip 33 for determining color densities, and which can also be used in connection with register determination as will be described below. However, it will be apparent that the test strip 33 is not essential to the practice of the present invention. The video camera 32 is better illustrated in FIG. 25 and is shown as a video camera including a macro-optical system 34. As is well known, a macro-optical system allows for very close and precise focus to create an enlarged image of the scanned subject matter.

Figure 2B:
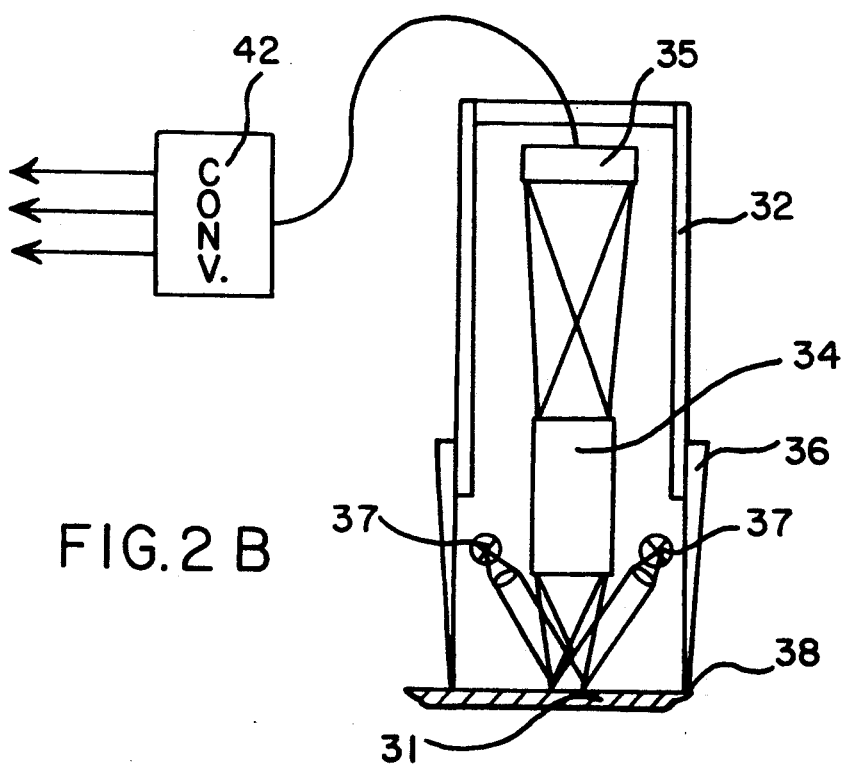

Thus, the printed sheet 31 shown in contact with the video camera in FIG. 2b is located at a precise distance from the macro-optical system 34 to produce an image on an enlarged scale on the image-converting element 35. The image is of adequate size to resolve individual dots in the printed image. The color video camera 32 is constructed as a one-chip or three-chip diode array in accordance with the conventional state of the art.

For positioning the video camera 32 at a precise distance from the printed sheet 31, the camera is preferably supported by support means 36, shown in the form of a cylindrical support affixed to the camera body and having a support surface 38 for contact with the printed sheet 31. The specific distance thus created between the optics 34 and the image on the sheet 31 gives a specific imaging ratio between the printed image on the sheet 31 and the video image on the image converter 35. Thus, a specific imaging ratio between the printed image on the sheet 31 and that on a display 40 (FIG. 2a) is also known. Thus, it is known by what enlargement factor a scale of 1 mm on the printed sheet is depicted on the image converter 35 or the CRT 40.

Integrated into the system of the color video camera is an illuminating system 37 together with associated optics to evenly illuminate the image location on the sheet 31. The illuminating system 37 may, for example, be arranged in the form of a ring surrounding the macrooptical system 34, thus avoiding gloss effects when recording image locations of freshly printed sheets.

Returning to FIG. 2a, it is seen that the color video camera 32 produces a signal which is passed to a signal converter 42 which converts the output signals of the image converting element 35 into standard RGB-signals, preferably in digital form. An RGB trio of digital values is thus obtained for each pixel of the image converter which correspond to the printed image locations being scanned. A corresponding number of RGB trios are thus obtained according to the number of pixels of the image-converting element 35 (number of lines times the number of columns). These signals are such that if they were fed to the color monitor 40 directly or through an appropriate graphic adapter, they would be combined to show the enlarged image of the scanned subject matter.

In an alternative embodiment, in order to avoid the need for the color video camera 32 to remain constantly on the printed sheet 31 during observation of the image location, the color video camera 32 may be followed by an image memory 44. The image derived from the converter 35 is thus passed to the image memory 44 for storage to create a permanent image which can be displayed on the color monitor 40 if desired or further processed as will be described below. In either event, either the camera creates the digital trios which are output by the converter 42 and passed to subsequent circuitry for processing, or the image is stored in image memory 44 for further processing.

In accordance with the invention, the color signals derived from the video camera 32 are passed to a color separation computer 45 to produce single color images in which image contours can be detected. The color separation computer 45 processes the RGB information derived by the video camera and produces color separation information related to the partial images of the individual colors printed to form the image. This information is then stored in units of a color separation memory 46. The color separation memory 46 is advantageously in the form of a binary memory in which one bit is provided in each unit for each pixel of the image converter 35. Thus, a zero is written into the bit in the case of paper-white and a one in the case of a presence of a corresponding color. Thus, each unit of the color separation memory 46 contains digital information regarding the distribution of the corresponding color on the paper, and the combination of the information in all of the color separation memories 46 relates to the multicolor printed image in that it contains information for all of the colors used to make up the image.

In the simple example of the two-color image referred to above, the color separation computer 45 produces two separations, corresponding to one partial image for cyan and one partial image for magenta. Accordingly, two separations are stored in the cyan and magenta units, respectively, of memory 46. Generally, the number of individual memory sub-units within the memory 46 depends on the maximum number of colors with which the system is to operate. In FIG. 2a, six sub-units are provided in the color separation memory 46, one each for the primary colors yellow, cyan, magenta, one for black, and two special colors designated "S" and "E".

The digital RGB signals are understood as being values between zero and 100% for each of the colors. They correspond to color values in a "colormetric system" based of the spectral transmission curves of specific red, green and blue filters, for example in accordance with the PAL standard. If the color points are transferred to a three-dimensional coordinate system, the result is a color cube, one corner of which corresponds to black ($R=G=B=0$) while the other corner reached by the spatial diagonal corresponds to the maximum white value ($R=G=B=100\%$). The other six points of the color cube correspond to the colors red, green, blue and the colors yellow, cyan and magenta.

In accordance with the RGB signal distribution delivered by the signal converter 42 in accordance with the image of the subject location on the image-converting element 35, the RGB values of specific pixels are in a spatial area corresponding to a yellow, a cyan or a magenta. The subtractive colors resulting from the superimposed print: blue (cyan+magenta), red (yellow+magenta) and green (cyan+yellow) and black (yellow+cyan+magenta) accordingly occupy the other spatial zones. The distinction as to paper-white or black is determined by the intensity (RGB sum). A distinction as to whether black is obtained by superimposed printing or by the black (B) ink is also possible, since the superimposed print gives more of a brown, i.e., a different RGB point, than the black ink. For each pixel the color separation computer 45 now checks whether the RGB signal originates from a yellow, a cyan, a magenta or a superimposition of corresponding colors, and inputs this "identified" pixel into the corresponding unit of the color separation computer 46. If, for example, a pixel yields an RGB signal originating from the superimposition of the colors cyan and magenta, this pixel is written in at the corresponding image location of the cyan unit and of the magenta unit of the color separation memory 46. If a pixel is not clearly allocated any color or color combination, it is written into all the units of the color separation memory 46 as paper-white, i.e., unprinted. Since the units of the color separation memory 46 are advantageously devised as binary memories, paper-white pixels, for example, correspond to 0 and a pixel in a unit of a specific color corresponds to a 1 in all the units of the color separation memory 46. As already described, therefore, each unit of memory 46 contains the distribution of the corresponding ink on paper-white in binary form.

The color separation calculation is advantageously carried out by converting the RGB values, for example, of memory 44, firstly into the HSI system (hue, saturation, intensity). This system gives a circular representation similar to the color indices to DIN 6164 (T:S:D: color tint, saturation, dark step).

Figure 3:
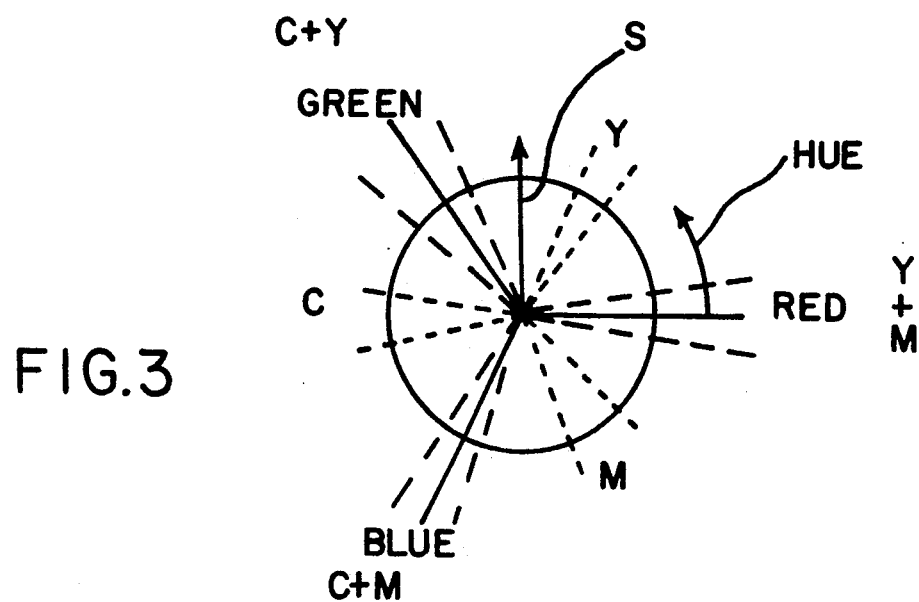
FIG. 3 is a diagram of a color chart illustrating a color separation computation.

In the HSI system, the pure colors yellow, cyan and magenta are situated in specific sectors of the tint circle as shown in FIG. 3. Colors of the superimposed print are situated in specific sectors therebetween. In FIG. 3, the axis for the intensity (I) is perpendicular to the drawing plane and the tint or hue corresponds to an angle and the saturation (S) is indicated by the distance from the center of the circle.

Identification of the inks or their combination in a superimposed print using HSI values is simpler, since only the hue of each pixel has to be checked. Only paper-white and black differ additionally by the intensity. Another advantage of the HSI system is that inks or superimposed prints always give a specific minimum saturation at the conventional color density values and conventional color assumption. This corresponds to a minimum distance (S) from the center of the circle in FIG. 3.

A particularly advantageous construction of the color separation computer 45 is obtained if it is so devised as to associate a pixel with a specific color/color combination only as from a specific minimum saturation value and/or in combination with the intensity. The action of the computer 45 is then comparable with a threshold color filter which does not pass a color until after a specific intensity and brightness. In other words, when the color separation computer 45 requires a specific minimum saturation value before storing a corresponding bit in the color separation memory 46, the computer 45 acts as a threshold color filter in which the color aspect of the filter separates the colors into the component parts for the color memory 46, and the threshold aspect of the filter requires a minimum intensity before the corresponding color is indicated as being present.

In a preferred embodiment, the color separation computer 45 is connected to a color value memory 50 in which, for example, the HSI values of the standard printing colors (e.g., the Europe scale) are stored individually and in superimposed printed form at standard densities on normal white paper. Additionally, however, it is advisable, before the actual measurement, to carry out a calibration measurement, for example, on the solid tint fields of a color check strip 33 on the printed sheet. For this purpose, the color video camera 32 is placed successively on the solid tint fields yellow, cyan, magenta, black, the superimposed prints thereof, and the special colors, and the RGB or HSI values are stored in the memory 50 in the form of color area zones. There is also a calibration for paper-white.

With these color values updated by the calibration it is possible to carry out an exact color separation by means of the computer 45, i.e., the enlarged subject location can be split up into color separations with appropriate filling in in the memory 46. If pixels determined from the RGB or HSI values do not give any clear association with a color (e.g., due to colored fiber stains in the paper), these pixels can, for example, be interpreted as unprinted, i.e., be associated with paper-white.

Before each measurement, it is also advisable to determine the imaging scale of the color video camera 32 by an additional calibration measurement. For this purpose, the color video camera 32 is placed on a specific calibration field which, for example, has two calibration lines at a known spacing. This calibration measurement thus determines how many lines and/or columns of the image-converting element 32 are situated between the calibration lines. This calibration measurement is then used to convert the register differences into mm. Alternatively, as noted above, when using a positioning mechanism 38 for the video camera which establishes a precise distance between the macro-optics 34 and the image 31, the magnification factor is predetermined and can be applied to the image without the necessity for scanning calibration marks.

The individual color separations stored in the memory 46 are fed to an image computer 47 by means of which they can be displayed on the color monitor 40 either individually or jointly. Since the units of the color separation memory 46 are constructed as binary memories, the cyan partial image, for example, is displayed on the color monitor of a uniform cyan. The display of paper-white again is effected correspondingly in a standard white. Thus, the units of the memory 46 require only a single memory cell in which data as to the color of the separation contained in the unit is stored.

A keyboard 60 and/or a control 61 (a mouse, joystick, roller ball or the like) is connected to the computer 47 to enable the printer to select the color separation he wishes to view individually. Moreover, a number of freely selectable separations can be placed one upon the other without displaying the subtractive colors resulting from the superimposed printing. The sequence of this superimposition of the color separations can also be freely selectable. Thus, the color sequence with which the register differences of a contour are best recognized can be selected.

Thus, by means of these components, i.e., the color separation computer 45, color separation memory 46 and image computer 47, it is possible to display the image from the color video camera 32 representing a subject location either directly in its natural form, or individually, or as a combination. These components constitute a convenient means for the visual assessment of register at contours of image locations in the print. By means of this aid, the experienced printer can assess the register differences and evaluate appropriate required adjustments. Of course, with the system described thus far, it is also possible to record the conventional register marks/register symbols and display them either simply enlarged or prepared in separations. Here again, the principle described of display in separations offers considerable advantages in register assessment.

In accordance with the invention, the information in the color separation memory 46 is processed in the image computer 47 to determine separation contours in the respective color images. A particular contour is identified by the printer such as by use of the keyboard 60 or joystick 61 or other means, the contour being a key image area such as that described in connection with FIGS. 1a–1c. The image computer 47 thereupon determines the location of the contour in each of the color separation images which go to make up the printed image. The offset between the contours in the respective images is then determined as a measure of the register difference for those particular color images.

Figure 4A:
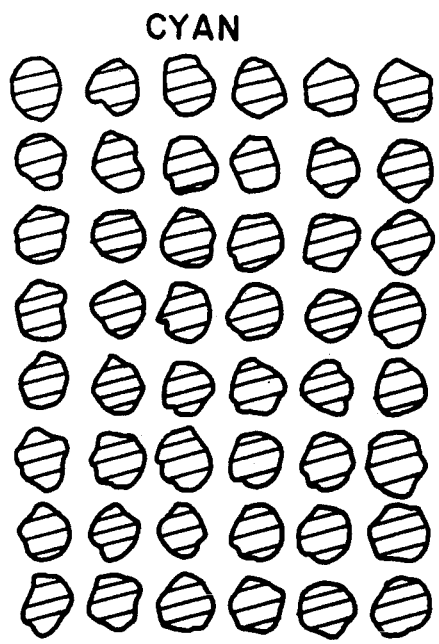
FIGS. 4a-4c are views similar to FIG. 1c but showing examples of separations of a number of partial images.
Figure 4C:
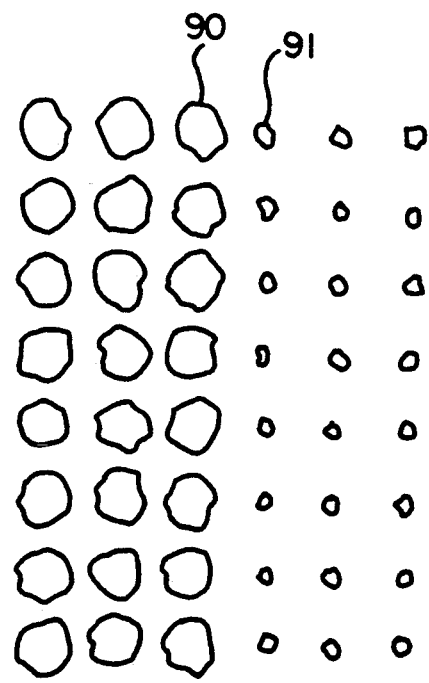

In the preferred form of this aspect of the invention, the pixel information in the color separation memory 46 is analyzed to determine the location of raster dots (i.e., the printed image dots) which make up the image for the respective separations. The raster dots below a specific size are preferably eliminated from the individual color separations. In other words, they are associated with paper-white. This is useful particularly if, unlike in the previous example, the contour in one or more of the partial images is formed by a distinct jump in raster dot size. In the originally selected simple example of the letter "P" as an unprinted area (paper-white) with a blue background (the superimposed printing of cyan and magenta). This would be equivalent to a light blue "P" on a dark blue background. The jump in brightness (brightness contour) then arises from the jump in raster dot size as illustrated in FIG. 4c. FIG. 4c shows a series of relatively large raster dots 90 followed by a further series of rather smaller raster dots 91, showing a jump in contrast from very bright to less bright. In practicing this aspect of the invention, all of the dots 91 would be associated with paper-white to more accurately define the contour between the bright blue image at 90 and the less bright image at 91. These modified color separations can also be displayed on the color monitor 40, selectively by use of the keyboard 60 and/or control 61, either individually or superimposed in a freely selected sequence.

Figure 4B:
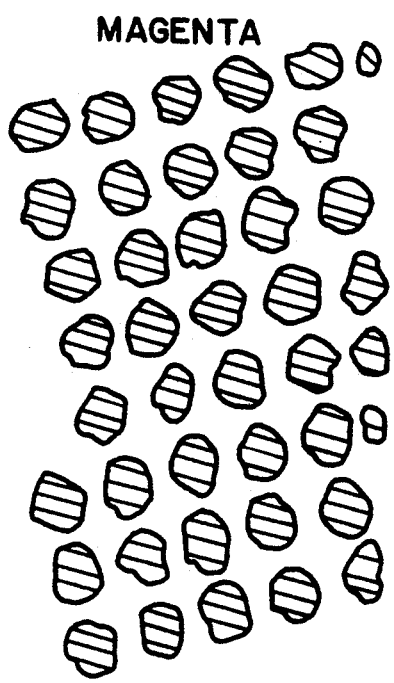

In accordance with the invention, the registered difference is now determined from the offset of the contours of the individual separations or modified separations (as a result of raster dot filtration, for example). According to the examples in FIG. 1c and FIGS. 4a and 4b, this is therefore determined from the offset of the cyan separation contour with respect to the magenta separation contour.

Figure 5:
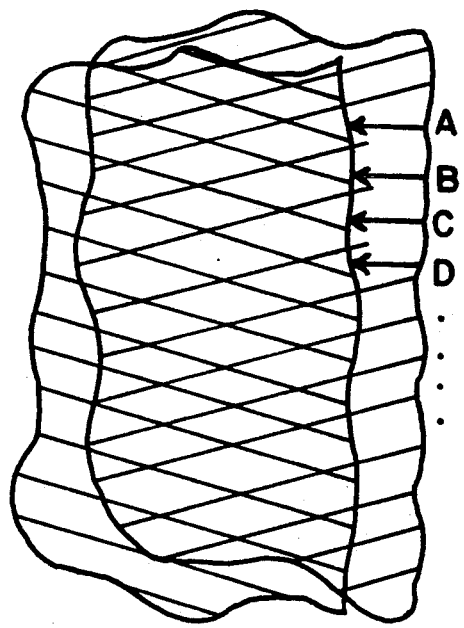
FIG. 5 is a diagram illustrating register differences at a contour.

To enable the offset of the contours to be calculated in relation to one another in the individual separations, the image computer 47 is so devised as to form a boundary line between the zone with raster dots and the zone without raster dots in each separation (FIG. 5). From the offset of these boundary lines, for example in two separations, in relation to one another, the register difference of one partial image with respect to a second is calculated.

This calculation is particularly simple if the contour (e.g. letters in a negative or reverse form) has arisen form the superimposed printing of two partial images in the solid tint. The boundary line in each color separation then simply corresponds to the boundary between the solid tint zone and the paper-white zone. Since, owing to the high degree of magnification and the roughness of the paper, this boundary has a highly jagged configuration, it can be smoothed mathematically, e.g. by interpolation.

The calculation of register differences, i.e. of distance vectors corresponding to the offset of the contours (boundary lines in the partial images) relative to one another, can be effected by way of averaging over a number of individual calculations (A, B, C, D, . . . in FIG. 5). The latter determination of register differences can, of course, also be effected at the contours of register marks, more particularly register crosses.

In the case of a contour formed, as in the simple example described hereinbefore, by the superimposed printing of at least two partial images with raster dots, then the area with raster dots can be completed or filled in to form a solid tint surface in each separation in the computer 47. This is done by associating the paper-white pixel between the raster dots with the corresponding separation color. The calculation or formation of boundary lines in the color separations, which then correspond to the contours in the partial images, is then effected as in the latter case of the contours formed by solid tint surfaces, and then the same applies to calculation of the register difference from the offset of the contours in the individual separations relative to one another. Calculation of the register difference in mm is then effected by image computer 47 via the known imaging scale.

Instead of determining the register differences from the relative offset of the boundary lines in the partial images, the register difference between two partial images can also be determined from the extreme value of a correlation calculation. For this purpose, a cross correlation function is formed from the image contents of two color separations (partial images).

If AC (S, Z) is the image content, for example, of the cyan separation, where S is the number of columns and Z is the number of lines of the image dots (pixels) of the separation stored in the memory 6, and accordingly AM (S, Z) represents the image content of the magenta separation, then the cross correlation as known from mathematics is defined as follows:

$$CM(x,y) = \int_{-S,-Z}^{+S,+Z} AC(s,z) \cdot AM(s + x, z + y) dS + dZ$$

S and Z denote the maximum number of columns and lines in the image-converting element 32, i.e. the corresponding maximum number of image dots (pixels) in an image line and image column). Value X, Y at which CM (X, Y) assumes its overall extreme value (maximum) thus gives the shift vector by which the magenta contour (separation) is offset from the cyan contour.

The X, Y value of the shift vector then only needs to be accurately converted to the imaging scale of the color video camera and then gives the register difference vector, for example in the unit mm.

Calculation of the cross correlation function can be reduced to one dimension, i.e., the integration extends only over the column and line direction if the contour of the image location is perpendicular to the column and line direction. According to FIG. 1c, the direction of the contour is perpendicular to the direction of the image lines—so that integration is carried out in each image line across the column direction, i.e. transversely of the contour.

With the process described and the corresponding apparatus elements it is possible to determine register differences in the image of the printed sheet at image locations having a number of contours. In order to determine the necessary register adjustments from these relative register differences of the corresponding partial images all that is now necessary is to determine the X and Y coordinates of each measured location, i.e., the image location, on the printed sheet. For this purpose, the printed sheet is placed, as is possible in color breakdowns, on a flat support and positioned by the edges of a corner against a stop. Such positioning of a printed sheet on a support is conventional is color matching consoles having traversing color density measuring heads. To determine the X and Y coordinates of the measured locations the camera 32 can be moved mechanically over the sheet, for example in a similar manner to the stylus of a plotter. Determination of the X and Y coordinates of the measured location on the sheet is then effected by position sensors disposed in the guide elements. Guidance after the style of a multiple articulation is also possible. The position of the color video camera 32 on the printed sheet is then determined by angular position sensors disposed in the pivots of the multiple articulation mechanism.

The X and Y coordinates of the measured locations and the register differences of the individual partial images as calculated by the image computer 47 can then be fed to a register computer 65 which from these values calculates the necessary adjustments for the side, circumferential and diagonal register in the individual printing units and, in another aspect, transmits them in the form of control commands to register adjustment means of said printing units. This is indicated by the arrows at register computer 65 in FIG. 2a.

If register difference are detected at a number of image locations, then image locations are given different weighing factors and the register computer 65 calculates an optimum register adjustment for all the measured locations form the corresponding register differences. This is particularly advantageous if, as is frequently found in multi-color offset prints, register differences in the image are not distributed uniformly over the sheet but, on the contrary, some locations are substantially in register whereas other have register differences. Register adjustments in that case can be effected only as an optimal compromise.

Figure 6:
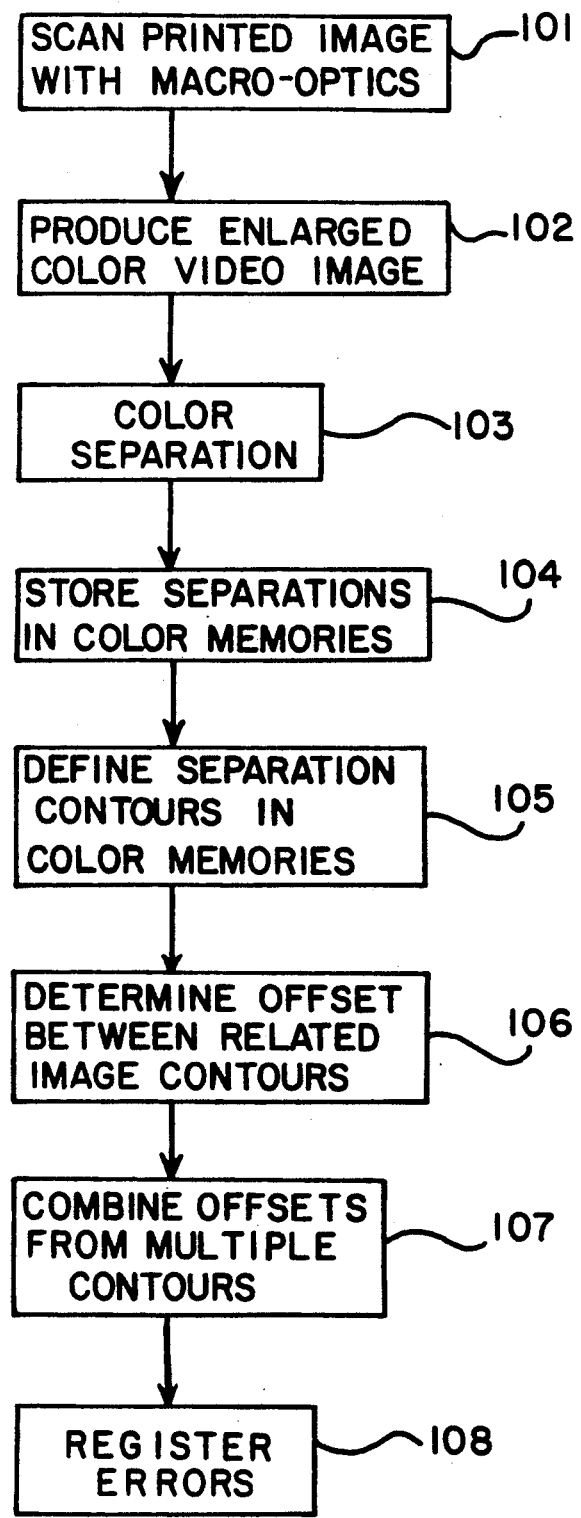
FIG. 6 is a flowchart illustrating a method exemplifying the present invention.

The method of the present invention is summarized in connection with FIG. 6. As a first step of the method, a step 101 is performed to scan the multi-color printed image with a macro-optic video camera. A step 102 then produces the standard RGB color signals representing the portion of the image which had been scanned in the step 101. The step 103 then performs a color separation operation on the signals to produce partial images relating to the colors which had been printed to comprise the image in the first instance. That information is stored in a step 104 in the respective memories which, it is recalled, had been illustrated at 46 in the system of FIG. 2a. Thus, the step 104 results in the storage in individual memories of digital information relating to the color separations which had made up the printed image originally scanned.

A step 105 is then performed to define separation contours in the color memories. It is recalled that the scanning had been accomplished in an area which included a key image, such as a reverse, or other important printed area from which register differences can be detected. The step 105 thereupon scans the information in the color separation memories to determine the contours in the respective images. As has been described above, that can be done by means of averaging dots, filling in dots, filtering dot size, or the like. In any event, the step 105 produces in each of the separations an indication of the location of the key image contour. A step 106 is then performed to determine the offset between such contours in the respective memories that can be determined by calculation of vectors between the contours, by cross-correlation, or by the other techniques described or suggested above. Having determined the offsets, in a system where multiple image areas are to be utilized before register corrections are made, a subsequent step 107 is performed to combine offsets from multiple contours taken at different coordinates of the image. The step 107 thereupon produces register error signals which are acted on in a step 108 to produce an indication of the register errors. Those errors can be acted on automatically or by intervention of a pressman to correct color register.

In a system where only a single image point is utilized to correct register errors, the step 107 can be dispensed with and the offsets determined in step 106 (appropriately scaled) are used for determination of register errors and the step 108.

It will thus be appreciated that what has been provided is an improved method and apparatus for determining differences in color registration. The image itself is scanned for input information. The scanning is accomplished at an enlarged scale by a macro-optical system so that the scanned information is of adequate resolution to reproduce the dots which make up the image. The pixel information from the image converter is stored in a digital format, but information from related dots is processed to determine key image contours. Thus, rather than operating on the dots or pixels individually, contours are determined from the separation information. The image contours are then compared for the respective separations which went to make up the image, and offsets between the contours are determined as a measure of register errors. As a result, the benefits of taking register errors directly from the image are achieved along with the accuracy conventionally thought to be associated with separate register scales, to achieve a method and system far superior to those proposed heretofore.

What is claimed is:

1. A method of determining register differences in a multi-color printed image formed of a plurality of superimposed single-color printed images, the method comprising the steps of:

scanning at least a part of the multi-color printed image with a color video camera to produce an enlarged electronic video image of a size adequate to resolve individual dots making up the image, processing the video image to derive a plurality of single-color images and storing the single-color images in respective color memories, selecting a register-checking location which includes a contour in the printed image comprising at least two superimposed single-colors, determining separation contours in the respective single-color images from the information stored in the respective color memories at the register-checking location, and determining offsets between the separation contours as a measure of register differences between the single color images.

2. The method as set forth in claim 1 wherein the step of determining separation contours comprises analyzing at least one characteristic of the dots making up the single-color image to define the separation contours.

3. The method as set forth in claim 2 wherein the step of scanning comprises scanning at least part of the image with a color video camera having a macro-optical system, producing multiple pixel images for each individual dot making up the printed image, and wherein the step of processing comprises storing information for the pixels of each single-color image.

4. The method as set forth in claim 3 further comprising the step of examining a plurality of contiguous pixels to determine the at least one characteristic of the data making up the single-color image.

5. The method as set forth in claim 3 further including the step of identifying from the pixel information in the respective color memories image dots of at least a given size, and identifying the areas in the image memory having dots larger than said predetermined size in order to identify said separation contours.

6. The method as set forth in claim 2 wherein the characteristic of the dots is size, and the step of determininq comprises eliminating all dots which are smaller than a predetermined size.

7. The method as set forth in claim 1 wherein the step of determining separation contours comprises cross-correlating pixel information in the respective single-color memories to determine offsets between contours in the image.

8. The method as set forth in claim 1 wherein the step of deriving a plurality of single color images comprises breaking down the multi-color image into an RGB color system conventionally associated with color video cameras.

9. The method as set forth in claim 1 wherein the step of deriving a plurality of single color images comprises deriving color separations in the HSI color system.

10. The method as set forth in claim 1 wherein the step of determining separation contours includes identifying image dots having at least a predetermined size, and filling in the image between identified dots to form a solid surface defining said contour.

11. The method as set forth in claim 1 in which the step of determining offsets comprises calculating distance vectors between separation contours determined in respective image memories.

12. The method as set forth in claim 11 in which the offset comprises the shift of one contour with respect to another in order to accurately superimpose said contours.

13. The method as set forth in claim 1 in which the step of determining includes sealing the offsets with respect to an enlargement factor associated with the video camera.

14. The method as set forth in claim 1 further comprising performing the steps to determine offsets for a plurality of register-checking locations, and combining the offsets determined for each register-checking location with coordinates for the register-checking location to determine a register error for the entire image.

15. A system for determining register differences in a multi-color printed image formed of a plurality of superimposed single-color printed images, the system comprising, in combination:

a color video camera having a macro-optical system for scanning at least a part of the multi-color printed image and producing an enlarged electronic image of a size adequate to resolve individual dots making up the printed image, video converter means for deriving a plurality of single-color images and storing the single-color images in respective color memories, means for defining a register-checking location in of the printed image which include a contour comprising at least two superimposed single-colors, image processing means for determining contours in the respective single-color images from the information stored in the respective color memories at the register-checking location, the image processing means further including means for determining offsets between the separation contours of the respective single color images as a measure of register differences between said single color images.

16. The system as set forth in claim 15 in which the video converter includes means for breaking the video image down into digital RGB or HSI information.

17. The system as set forth in claim 15 in which the color memories each comprise a plurality of pixel memories related to the pixel resolution of the video camera.

18. The system as set forth in claim 15 in which the color memories have separate sections associated with the colors used to form the multi-color printed image.

19. The system as set forth in claim 15 further including calibration means for scanning a calibration mark having a known offset, and means for scaling the offsets determined in the image processing means by said known offset.

20. The system as set forth in claim 15 further including means for defining coordinates of a plurality of register-checking locations on the printed image, and means for coordinating the coordinates for the respective register-checking locations with the offsets determined for those locations to determine a register error for the entire image.

* * * * *